(12) United States Patent
Kim et al.

(10) Patent No.: US 7,872,302 B2
(45) Date of Patent: Jan. 18, 2011

(54) SEMICONDUCTOR DEVICE HAVING VERTICAL TRANSISTOR FORMED ON AN ACTIVE PATTERN PROTRUDING FROM A SUBSTRATE

(75) Inventors: Hui-Jung Kim, Seoul (KR); Jae-Man Yoon, Seoul (KR); Yong-Chul Oh, Geonggi-do (KR); Hyun-Woo Chung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 337 days.

(21) Appl. No.: 12/014,370

(22) Filed: Jan. 15, 2008

(65) Prior Publication Data
US 2008/0179693 A1 Jul. 31, 2008

(30) Foreign Application Priority Data
Jan. 15, 2007 (KR) .................. 10-2007-0004126
Dec. 14, 2007 (KR) .................. 10-2007-0130983

(51) Int. Cl.
*H01L 29/78* (2006.01)
*H01L 21/335* (2006.01)
(52) U.S. Cl. ............... 257/329; 257/401; 257/E29.262

(58) Field of Classification Search .............. 257/302, 257/328, 329, 513, E29.257, 401, E29.262
See application file for complete search history.

(56) References Cited

U.S. PATENT DOCUMENTS

| 5,106,775 | A | * | 4/1992 | Kaga et al. .................. 438/155 |
| 5,929,477 | A | | 7/1999 | McAllister Burns, Jr. et al. |
| 6,818,937 | B2 | | 11/2004 | Noble et al. |
| 2007/0246783 | A1 | * | 10/2007 | Moon et al. .................. 257/384 |
| 2008/0173937 | A1 | * | 7/2008 | Chung et al. ................. 257/329 |

FOREIGN PATENT DOCUMENTS
KR 618875 8/2006

* cited by examiner

*Primary Examiner*—Anh D Mai
(74) *Attorney, Agent, or Firm*—Myers Bigel Sibley & Sajovec, P.A.

(57) ABSTRACT

A semiconductor device includes a first active pattern protruding from a substrate, a second active pattern on the first active pattern, a gate electrode enclosing a sidewall of the second active pattern, a conductive layer pattern on the first active pattern, a first impurity region in the first active pattern, and a second impurity region at a surface portion of the second active pattern. The first active pattern extending along a predetermined direction may have a first region and a second region. The second active pattern may have a pillar structure and the conductive layer pattern may include a metal or a metal compound.

8 Claims, 14 Drawing Sheets

SEMICONDUCTOR DEVICE HAVING VERTICAL TRANSISTOR FORMED ON AN ACTIVE PATTERN PROTRUDING FROM A SUBSTRATE

CROSS-REFERENCE TO RELATED APPLICATIONS

This application claims priorities under 35 U.S.C. §119 to Korean Patent Application No. 2007-4126 filed on Jan. 15, 2007 and Korean Patent Application No. 2007-130983 filed on Dec. 14, 2007 in the Korean Intellectual Property Office (KIPO), the contents of which are herein incorporated by reference in their entireties.

BACKGROUND OF THE INVENTION

1. Field of the Invention

Example embodiments of the present invention relate to a semiconductor device and a method of manufacturing a semiconductor device. More particularly, example embodiments of the present invention relate to a semiconductor device including a transistor having a channel substantially perpendicular to a substrate, and a method of manufacturing the semiconductor device.

2. Description of the Related Art

In a semiconductor memory device, a transistor includes a source region providing charge carriers, for example, electrons or holes, a drain region draining the charge carriers from the source region, and a gate electrode adjusting a current flowing between the source and the drain regions. When the current is adjusted by a voltage applied to the gate electrode of the transistor, the transistor is referred to as a field effect transistor. Here, a channel of the transistor includes a passage through which the charge carriers pass from the source region to the drain region. The channel is provided between the source and drain regions. The transistor further includes a gate insulation layer formed between a substrate and the gate electrode for electrically insulating the gate electrode from the substrate.

As the degree of integration degree of the semiconductor memory device increases, the cross-sectional area of the gate electrode sharply decreases. As the cross-sectional area of the gate electrode decreases, problems such as a short channel effect may occur in the transistor. The short channel effect causes various problems such as an increase of a leakage current in the transistor, a decrease of a breakdown voltage of the transistor, a continuous increase of a current caused by a voltage applied to the drain region, etc.

The short channel effect is generally generated by a shortened length of the channel between the source and the drain regions. Recently, a transistor having a source region and a drain region formed perpendicular to a substrate has been suggested. The transistor includes a channel formed perpendicular to the substrate between the source and drain regions.

FIG. 1 is a perspective view illustrating a conventional semiconductor device and FIG. 2 is a cross-sectional view illustrating the conventional semiconductor device.

Referring to FIGS. 1 and 2, a transistor having perpendicular channels includes lower active patterns 12 protruding from a substrate 10, upper active patterns 14 having pillar structures formed on the lower active patterns 12, gate insulation layer patterns (not illustrated) enclosing the upper active patterns 14, gate electrodes 18 formed on the gate insulation layer patterns, first impurity regions 20 formed at surface portions of the lower active patterns 12 and second impurity regions 22 formed at surface portions of the upper active patterns 14.

The gate electrodes 18 are formed between the first impurity regions 20 and the second impurity regions 22 so that the perpendicular channels are formed on the upper active patterns 14.

The first impurity regions 20 extend along a predetermined direction substantially the same as an extending direction of each of the lower active patterns 12. The first impurity regions 20 serve as bit lines. The bit lines are referred to as buried bit lines because the bit lines are formed under the transistor.

Electrical resistances of the first impurity regions 20 may increase because areas of the first impurity regions 20 adjacent to the upper active patterns 14 decrease. Namely, electrical resistances of the bit lines may increase so that the electrical reliability of the semiconductor device including the bit lines may be considerably reduced.

SUMMARY OF THE INVENTION

According to one aspect of the present invention, there is provided a semiconductor device including a first active pattern, a second active pattern, a gate electrode, a thin layer, a first impurity region and a second impurity region. The first active pattern protruding from a substrate may include a first region and a second region and may extend along a first direction. The second active pattern may have a pillar structure and may be formed on the first region of the first active pattern. The gate electrode may enclose a sidewall of the second active pattern. The thin layer having a conductive material may be formed on the second region of the first active pattern. The first impurity region may be formed into the second region of the first active pattern. The second impurity region may be formed into a surface portion of the second active pattern.

In an example embodiment of the present invention, the first active pattern may include a protruding portion that protrudes along a second direction different from the first direction, and the protruding portion may include at least a portion of the first region of the first active pattern.

In an example embodiment of the present invention, the thin layer may include a metal or a metal compound. For example, the thin layer may include cobalt (Co), titanium (Ti), cobalt silicide ($CoSi_x$), titanium silicide ($TiSi_x$), etc.

According to one aspect of the present invention, there is provided a semiconductor device including lower active patterns protruding from a substrate, upper active patterns having pillar structures, gate electrodes enclosing sidewalls of the upper active patterns, thin layer patterns having conductive materials, first impurity regions and second impurity regions formed into surface portions of the upper active patterns. The lower active patterns may include first regions and second regions and may extend along a first direction. The upper active patterns may be formed on the first regions of the lower active patterns. The thin layer patterns may be formed on the second regions of the lower active patterns. The first impurity regions may be formed into the second regions of the lower active patterns.

In an example embodiment of the present invention, the lower active patterns may include protruding portions protruding along a second direction different from the first direction, and the protruding portions may include at least a portion of each of the first regions of the lower active patterns.

In an example embodiment of the present invention, the lower active patterns may include first sidewalls and second sidewalls, and the first and second sidewalls face each other along a third direction substantially perpendicular to the first direction, and the protruding portions may be disposed adjacent to the first sidewalls.

In an example embodiment of the present invention, the lower active patterns may include first sidewalls and second sidewalls, and the first and second sidewalls may face each other along a third direction substantially perpendicular to the first direction, and the protruding portions may be disposed adjacent to the first and second sidewalls and are arranged in a zigzag structure.

In an example embodiment of the present invention, the semiconductor device may further include field insulation layer patterns covering the lower active pattern, word lines formed on the field insulation layer patterns. The word lines may make electrical contact with one selected from the gate electrodes formed on the upper active patterns disposed on each of the lower active patterns.

In an example embodiment of the present invention, the thin layer patterns include a metal or a metal compound. For example, the thin layer may include cobalt (Co), titanium (Ti), cobalt silicide ($CoSi_x$), titanium silicide ($TiSi_x$), etc.

According to another aspect of the present invention, there is provided a method of manufacturing a semiconductor device. In the method of the manufacturing the semiconductor device, first masks and upper active patterns having pillar structures are formed on a substrate. Preliminary first impurity regions are formed in portions of the substrate adjacent to the upper active patterns by implanting first impurities. A thin layer having conductive materials is formed on the portions of the substrate adjacent to the upper active patterns. Sacrificial spacers are formed on sidewalls of the upper active patterns and the first masks. Second masks partially exposing the sacrificial spacers, the first masks and the thin layer are formed on the substrate. Thin layer patterns, first impurity patterns and lower active patterns each extending along a first direction are formed by etching the thin layer, the preliminary first impurity regions and the substrate using the sacrificial spacers and the second masks. Surfaces of the upper active patterns are exposed by removing the first masks. Second impurity regions are formed into the surface portions of the upper active patterns by implanting second impurities.

In an example embodiment of the present invention, the first masks may include a nitride.

In an example embodiment of the present invention, the sacrificial spacers may include a material having an etching selectivity with respect to the substrate, and the sacrificial spacers may include an oxide.

In an example embodiment of the present invention, the second masks may be formed by forming a first layer on the first masks, the sacrificial spacers and the thin layer to cover the lower active patterns, forming a second layer on the first layer, forming photoresist patterns on the second layer, etching the second layer using the photoresist patterns as a first etching mask and etching the first layer using the etched second layer as a second etching mask.

In an example embodiment of the present invention, the first and second layers may include a material having an etching selectivity with respect to the sacrificial and the substrate. The first layer may include silicon-on-carbon (SOC). The second layer may include an anti-reflective coating (ARC) compound containing a silicon (Si).

In an example embodiment of the present invention, after forming the lower active patterns, the second masks may be removed. The second masks may be removed by an ashing process and/or a stripping process.

In an example embodiment of the present invention, after forming the first impurity regions and the lower active patterns, field isolation layer patterns may be formed to cover the lower active patterns. Word lines may be formed on the field isolation layer patterns. The word lines may make electrical contact with one selected from the gate electrodes formed on the upper active patterns disposed on each of the lower active patterns. An insulation interlayer may be formed on the word lines. A surface of the insulation interlayer may have substantially the same height as that of each of the upper active patterns.

According to the present invention, the areas of the bit lines may increase because the upper active patterns are formed on sides of the lower active patterns so that electrical resistances of the bit lines may be reduced.

The bit lines include the thin layer patterns having the conductive materials and the first impurity regions. Therefore, the electrical resistances of the bit lines may be reduced.

Additionally, in an etching process of a substrate to form the lower active patterns, the second masks include a first layer having SOC and a second layer having an ARC containing silicon are used as an etching mask so that the substrate may be easily etched. The second masks may be easily removed by an ashing process and/or a stripping process.

BRIEF DESCRIPTION OF THE DRAWINGS

The above and other features and advantages of the present invention will become more apparent by describing in detailed example embodiments thereof with reference to the accompanying drawings, in which.

DESCRIPTION OF THE EMBODIMENTS

Figure 1:
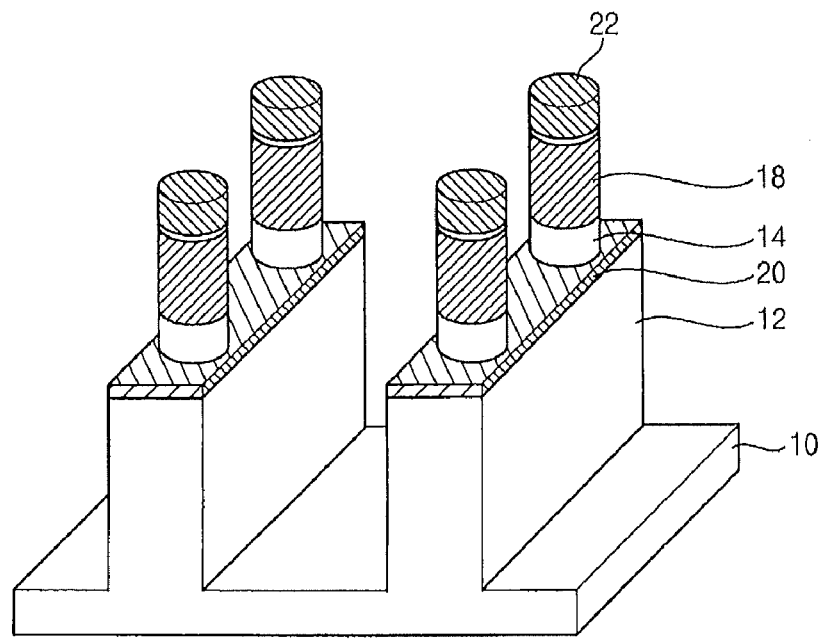
FIG. 1 is a perspective view illustrating the conventional semiconductor device.
Figure 2:
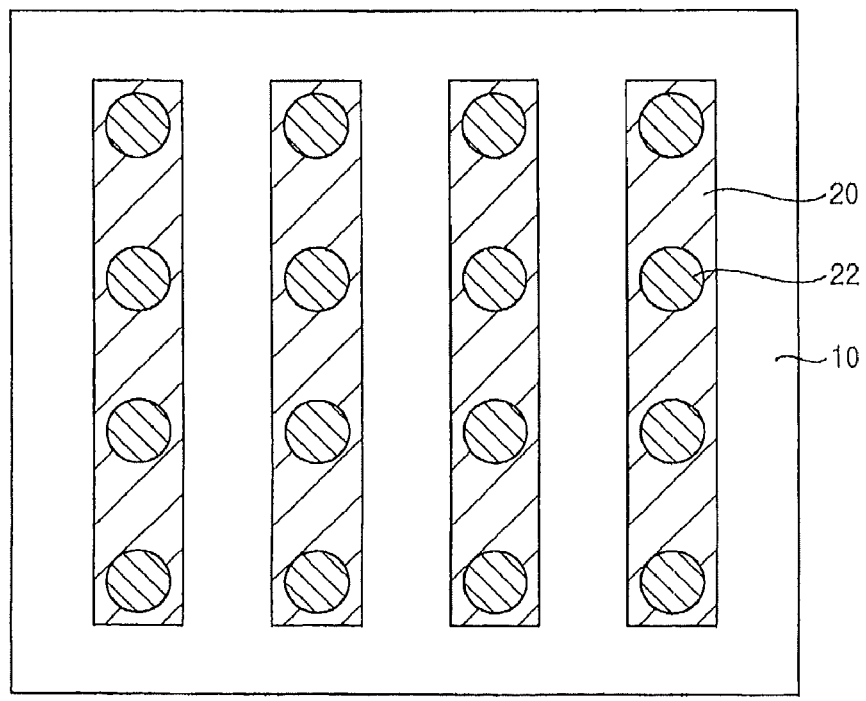
FIG. 2 is a cross-sectional view illustrating the conventional semiconductor device in FIG. 1.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above." "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising." when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation is performed. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
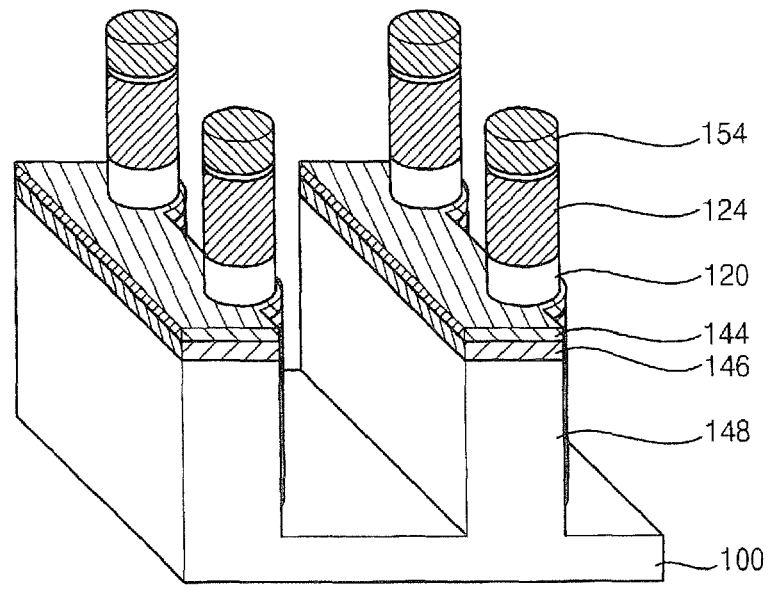
FIG. 3 is a perspective view illustrating a semiconductor device in accordance with example embodiments of the present invention.
Figure 4:
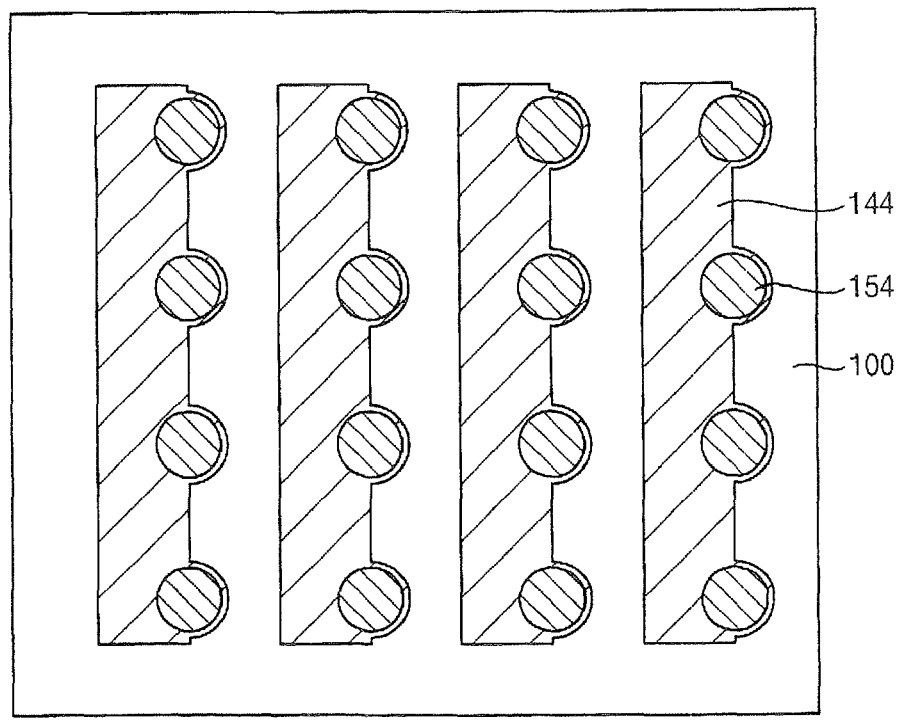
FIG. 4 is a cross-sectional view illustrating the semiconductor device in FIG.

FIG. 3 is a perspective view illustrating a semiconductor device in accordance with example embodiments of the present invention, and FIG. 4 is a cross-sectional view illustrating the semiconductor device in FIG. 3.

Referring to FIGS. 3 and 4, the semiconductor device includes lower active patterns 148 protruding from a substrate 100, upper active patterns 120, gate insulation layer patterns (not illustrated), gate electrodes, conductive layer patterns 114, first impurity regions 146, and second impurity regions 154.

Referring to FIGS. 3 and 4, the semiconductor device includes lower active patterns 148 protruding from a substrate 100, upper active patterns 120, gate insulation layer patterns (not illustrated), gate electrodes, conductive layer patterns 144, first impurity regions 146, and second impurity regions 154.

The lower active patterns 148 may be upwardly protruding from the substrate 100. That is, the lower active patterns 148 may protrude along a direction substantially perpendicular to an upper face of the substrate 100. Each of the lower active patterns 148 may include a material substantially the same as that of the substrate 100. For example, each of the lower active patterns 148 may include single crystalline silicon or single crystalline germanium. Each of the lower active patterns 148 may extend along a first direction on the substrate 100. Further, the adjacent lower active patterns 148 may be arranged along a second direction on the substrate 100. The first direction may be substantially perpendicular to the second direction.

The lower active patterns 148 may include first lower regions and second lower regions, respectively. The upper active patterns 120 may be positioned on the first lower regions of the lower active patterns 148. The first impurity regions 146 and the conductive layer patterns 144 may be located in the second lower regions of the lower active patterns 148.

In example embodiments, each of the lower active patterns 148 may include a first sidewall and a second sidewall. The first and second sidewalls may face each other along the second direction. The first sidewalls of the lower active patterns 148 may include protruding portions. The protruding portions may extend from the first lower regions to the second lower regions of the lower active patterns 148.

The upper active patterns 120 are provided on the lower active patterns 148, respectively. Each of the upper active patterns 120 may protrude from each of the lower active patterns 148. For example, the upper active patterns 120 may have a circular or a polygonal pillar structures. In example embodiments, the upper active patterns 120 may include a material substantially the same as that of the lower active patterns 148. For example, the upper active patterns 120 may include single crystalline silicon or single crystalline germanium.

In example embodiments, the upper active patterns 120 may be respectively located on the first portions of the lower active patterns 148. The upper active patterns 120 may be arranged on the upper active patterns 148 along the first direction and the second direction. The upper active patterns 120 arranged in the first direction may be disposed along a first virtual line whereas the upper active patterns 120 arranged in the second direction may be disposed along a second virtual line. Here, the adjacent upper active patterns 120 arranged along the first direction may be separated from each other by a first interval, and adjacent upper active patterns 120 arranged in the second direction may be spaced apart from each other by a second interval. In an example embodiment, the first interval may be substantially the same as the second interval.

In example embodiments, the upper active patterns 120 may include first upper regions, second upper regions and third upper regions. The second impurity regions 154 may be located in the first upper regions of the upper active patterns 120. The gate insulation layer patterns and the gate electrodes 124 may be positioned in the second upper regions of the upper active patterns 120. The third upper portions of the upper active patterns 120 may prevent mutual interference among the gate electrodes 124, the conductive layer patterns 144 and the first impurity regions 146 formed on the lower active patterns 148. The first and the third upper regions of the upper active patterns 120 may have substantially level sidewalls. Cross-sectional areas of the second upper regions of the upper active patterns 120 may be substantially smaller than cross-sectional areas of the first and the third upper regions. The second upper regions of the upper active patterns 120 may have curved or rounded sidewalls. For example, recesses may be formed on the sidewalls of the second upper regions of the upper active patterns 120, respectively.

The gate insulation layer patterns enclose the upper active patterns 120. In example embodiments, the gate insulation layer patterns may be formed in the recesses of the second upper regions of the upper active patterns 120. Here, the recesses may be partially filled with the gate insulation layer patterns.

Each of the gate insulation layer patterns may include an oxide or a metal compound. For example, the gate insulation layer patterns may include silicon oxide (SiOx), hafnium oxide (HfOx), zirconium oxide (ZrOx), aluminum oxide (AlOx), tantalum oxide (TaOx), etc.

The gate electrodes 124 are provided on the gate insulation layer patterns to enclose the upper active patterns 120. The gate electrodes 124 may fully fill the recesses formed on the second upper regions of the upper active patterns 120.

The gate electrodes 124 may include polysilicon doped with impurities, metals or metal compounds. For example, the gate electrodes 124 may include tungsten (W), tungsten nitride (WNx), tungsten silicide (WSix), titanium (Ti), titanium nitride (TiNx), titanium silicide (TiSix), aluminum (Al), aluminum nitride (AlNx), tantalum (Ta), tantalum nitride (TaNx), tantalum silicide (TaSix), cobalt silicide (CoSix), etc.

The first impurity regions 146 are formed at surface portions of the lower active patterns 148. In example embodiments, the first impurity regions 146 may be formed at the second upper regions of the lower active patterns 148. The first impurity regions 146 may extend toward the lower active patterns 148 under the first active patterns 120. The first impurity regions 146 may serve as source/drain regions of transistors. Further, the first impurity regions 146 may be employed as wirings such as bit lines.

The first impurity regions 146 may include first impurities. In example embodiments, the first impurity regions 146 may include N-type impurities or P-type impurities. For example, the N-type impurities may include phosphorus (P), arsenic (As), antimony (Sb), etc. Further, the P-type impurities may include boron (B), gallium (Ga), indium (In), etc.

The second impurity regions 154 are formed at surface portions of the upper active patterns 120. For example, the second impurity regions 154 may be formed at the first upper regions of the upper active patterns 120. The second impurity regions 154 may serve as the source/drain regions of the transistors together with the first impurity regions 146.

The second impurity regions 154 may include second impurities. The second impurities may also include N-type impurities or P-type impurities. For example, the N-type impurities may include phosphorus (P), arsenic (As), antimony (Sb), etc. The P-type impurities may include boron (B), gallium (Ga), indium (In), etc. In example embodiments, the first impurities of the first impurity regions 146 may be substantially the same as the second impurities of the second impurity regions 154.

In some example embodiments, each of the transistors may include the gate insulation layer patterns, the gate electrodes 124, the first impurity regions 146 and the second impurity regions 154. When, the gate electrodes 124 enclose the upper active patterns 120, and the first and the second impurity regions 146 and 154 are disposed above and below the gate electrodes 124, respectively, a channel region of the transistor may be provided in each of the upper active patterns 120 along a direction substantially perpendicular to the substrate 100. Here, the gate insulation layer patterns between the gate electrodes 154 and the upper active patterns 120 may electrically insulate the channel region from the gate electrodes 154. The transistor having the above construction may be referred to as a transistor having a perpendicular channel region.

The conductive layer patterns 144 including the conductive materials are formed between the lower active patterns 148 and the upper active patterns 120. In example embodiments, the conductive layer patterns 144 may be positioned at the second lower regions of the lower active patterns 148.

The conductive layer patterns 144 may include a metals or a metal compound. For example, the conductive layer patterns 144 may include cobalt (Co), titanium (Ti), cobalt silicide (CoSix), titanium silicide (TiSix), etc.

The conductive layer patterns 144 may serve as the wiring, such as the bit lines, together with the first impurity regions 146. In other words, the wirings may include the conductive layer patterns 144 and the first impurity regions 146, respectively. Thus, electrical resistances of the wirings may decrease because the conductive layer patterns 144 include the metals or the metal compounds.

According to example embodiments of the present invention, since the upper active patterns 120 are disposed on peripheral portions of the lower active patterns 148, the areas of the second lower regions of the lower active patterns 148 serving as the wirings, such as the bit lines, may be increased, thereby reducing the electrical resistances of the wirings. Further, the electrical resistances of the wirings may further decrease because the wirings include the conductive layer patterns 144 containing the metals or the metal compounds.

In other words, partial pillar structures protrude from the side walls of the lower active portions 148. The pillar structures are partial in the sense that only a portion of what would be a complete pillar structure protrude from the side wall. Furthermore, these protruding (i.e., peripheral portions of lower active patterns 148) support the conductive layer patterns which have a profile that is aligned to the underlying lower active patterns 148 including the partial pillar structures that protrude from the side walls thereof.

The upper active patterns 120 (including the first, second and third upper regions) has a completer pillar structure where the side wall of the complete pillar structure follows the side wall of the partial pillar structures protruding from the side walls of the lower active patterns 148. Accordingly, the upper patterns 120 are offset from a central portion of the conductive layer patterns 144 so that a majority of the structure of the conductive layer patterns in the first impurity regions 146 (which may provide, for example, bit lines) can be unobstructed by the complete pillar structure to allow a reduced resistance conductive layer (such as for a bit line) in some embodiments according to the invention.

Figure 5:
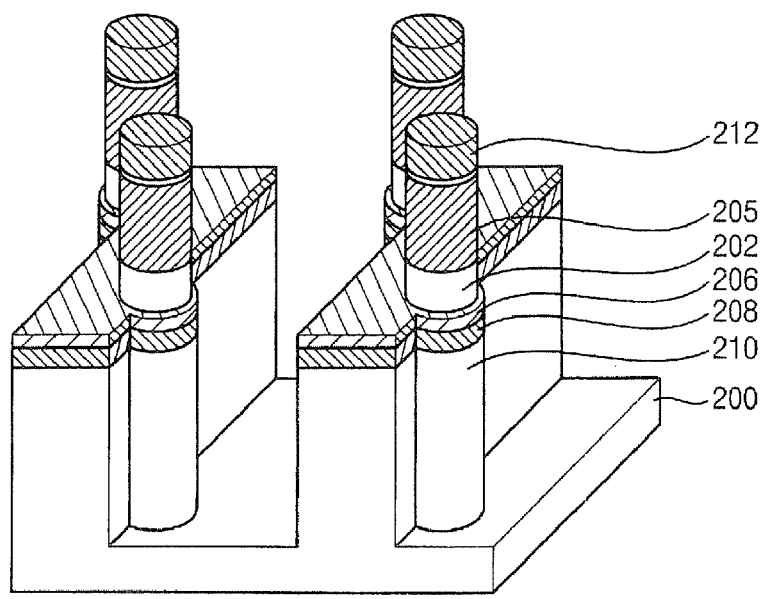
FIG. 5 is a perspective view illustrating a semiconductor device in accordance with example embodiments of the present invention.
Figure 6:
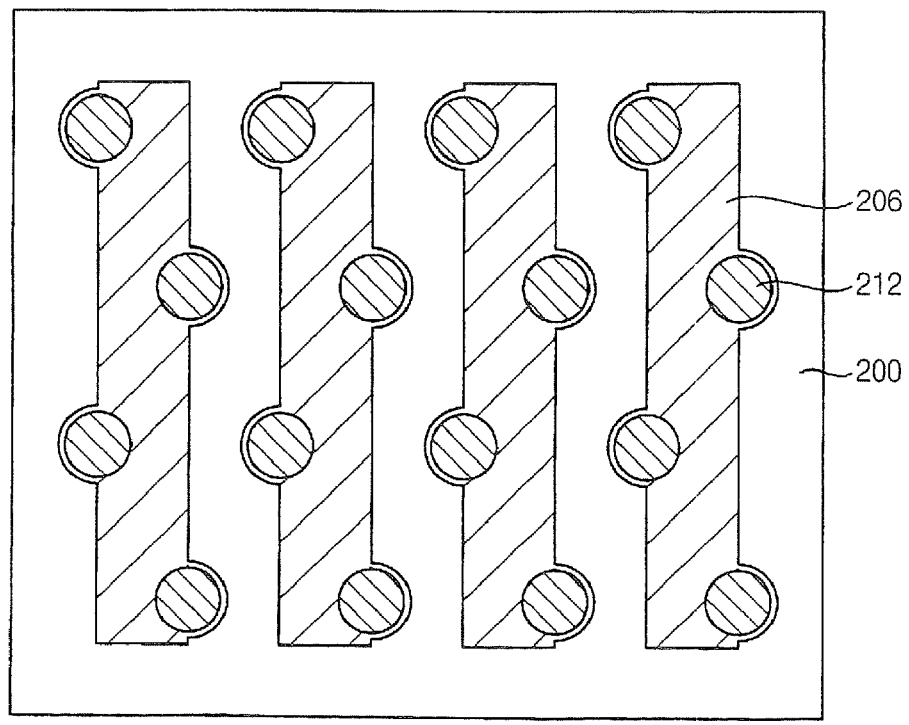
FIG. 6 is a cross-sectional view illustrating the semiconductor device in FIG. 5.

FIG. 5 is a perspective view illustrating a semiconductor device in accordance with example embodiments of the present invention, and FIG. 6 is a cross-sectional view illustrating the semiconductor device in FIG. 5.

Referring to FIGS. 5 and 6, the semiconductor device includes lower active patterns 210 provided on a substrate 200, upper active patterns 202, gate insulation layer patterns (not illustrated), gate electrodes 205, conductive layer patterns 206, first impurity regions 208, and second impurity regions 212.

The lower active patterns 210 protrude from the substrate 200 along a direction substantially perpendicular to the substrate 200. The lower active patterns 210 may extend along a first direction. The lower active patterns 210 may be arranged in a second direction substantially perpendicular to the first direction.

The lower active patterns 210 may include first lower regions and second lower regions. The upper active patterns 202 may be located on the first lower regions of the lower active patterns 210. The first impurity regions 208 and the conductive layer patterns 206 are formed in the second lower regions of the lower active patterns 210.

In some example embodiments, the lower active patterns 210 may include first sidewalls and second sidewalls. Each of the first and the second sidewalls may face each other along the second direction. The lower active patterns 210 may include first protruding portions provided on the first sidewalls and second protruding portions formed on the second sidewalls. The first and the second protruding portions may belong to the first lower regions of the lower active patterns 148, respectively. The first and the second protruding portions may be alternatively disposed on the substrate 200. For example, the first and the second protruding portions may be arranged in a zigzag structure. The second lower regions of the lower active patterns 210 may extend continuously on the substrate 200.

The upper active patterns 202 are disposed on the lower active patterns 210, respectively. Each of the upper active patterns 202 may protrude from each of the lower active patterns 210. The upper active patterns 202 may have circular or polygonal pillar structures.

In some example embodiments, the upper active patterns 202 may be formed on the first lower regions of the lower active patterns 210. The upper active patterns 202 may be disposed adjacent to the first and the second sidewalls of the lower active patterns 202. The upper active patterns 202 may be arranged along the first direction and the second direction. The upper active patterns 202 arranged along the first direction may be disposed in a zigzag structure, and the upper active patterns 202 arranged along the second direction may be disposed in a virtual line. Here, the upper active patterns 202 arranged in the first direction may be separated by a first interval, whereas the upper active patterns 202 arranged along the second direction may be spaced apart by a second interval. The first interval may be substantially different from the second interval. For example, a ratio between the first and the second intervals may be about $\sqrt{2}:1$.

In FIGS. 5 and 6, detailed descriptions regarding the lower active patterns 210, the upper active patterns 202, the gate insulation layer patterns, the gate electrodes 205, the thin layer patterns 206, the first impurity regions 208 and the second impurity regions 212 will be omitted because these elements are substantially the same as or substantially similar to those of the semiconductor device described with reference to FIGS. 3 and 4.

FIGS. 7 to 28 are cross-sectional views illustrating a method of manufacturing a semiconductor device in accordance with example embodiments of the present invention. Although a method of manufacturing the semiconductor device in FIGS. 3 and 4 will be described with reference to FIGS. 7 to 28, a method of manufacturing the semiconductor device in FIGS. 5 and 6 may be substantially the same as or substantially similar to the method of manufacturing the semiconductor device described with reference to FIGS. 7 to 28 except for masks for forming lower and upper active patterns.

Figure 7:
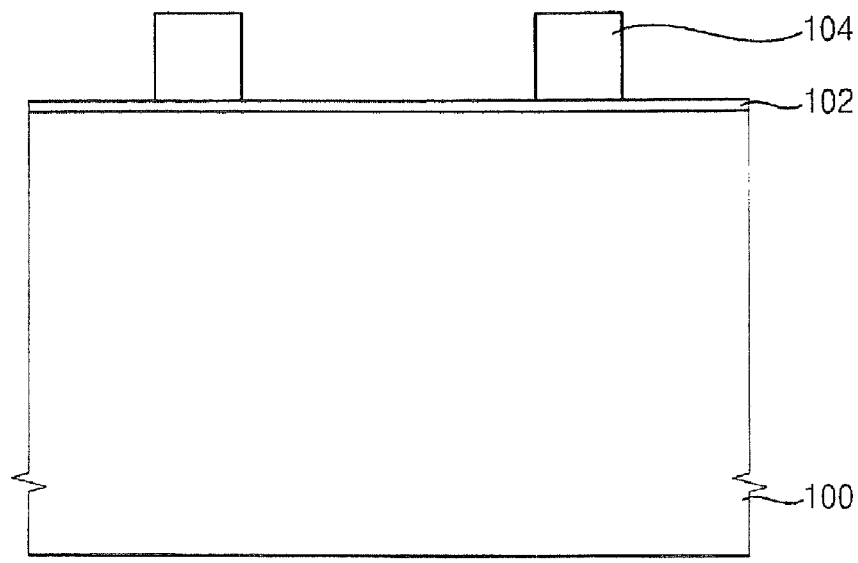
FIGS. 7 to 28 are cross-sectional views illustrating a method of manufacturing a semiconductor device in accordance with example embodiments of the present invention.

Referring to FIG. 7, a pad oxide layer 102 is formed on a substrate 100, and then first masks 104 are provided on the pad oxide layer 102.

The substrate 100 may include a single crystalline silicon substrate, a single crystalline germanium substrate, an SOI substrate, a GOI substrate, etc. The pad oxide layer 102 may be formed using an oxide such as silicon oxide by a thermal oxidation process or a chemical vapor deposition (CVD) process. The pad oxide layer 102 may reduce stress generated between the substrate 100 and the first masks 104.

Each of the first masks 104 may be formed using a material that has an etching selectivity with respect to the substrate 100. For example, the first mask 104 may be formed using a nitride such as silicon nitride, or an oxynitride such as silicon oxynitride. Further, the first mask 104 may be formed by a CVD process or an atomic layer deposition (ALD) process.

In example embodiments, the first masks 104 may have polyhedral strictures. For example, the first masks 104 may have hexahedral structures. Alternatively, the first masks 104 may have circular or polygonal pillar structures.

Figure 8:
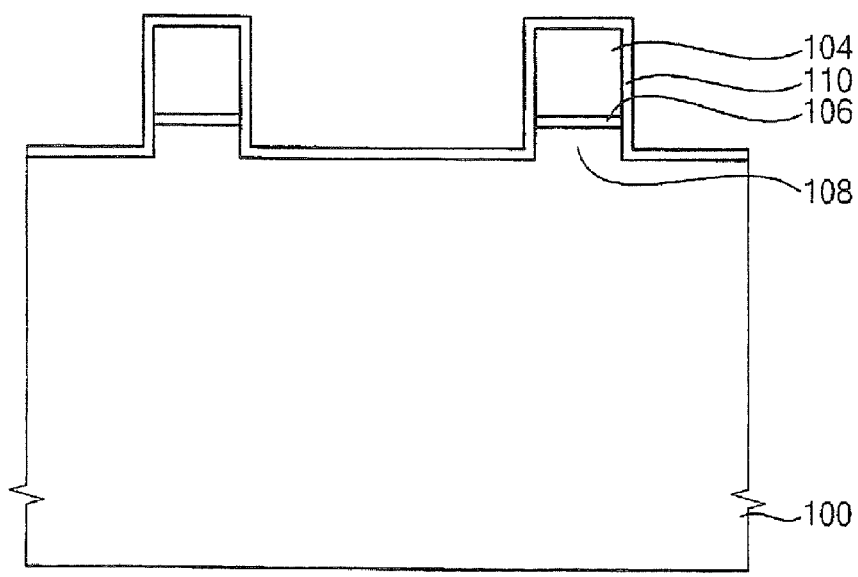

Referring to FIG. 8, the pad oxide layer 102 and substrate 100 are partially etched using the first masks 104 as etching masks to form pad oxide layer patterns 106 and first patterns 108. The pad oxide layer patterns 106 and the first patterns 108 may be formed by an anisotropic etching process.

In some example embodiments, each of the first patterns 108 may include a material substantially the same as that of the substrate 100 since the first pattern 108 is formed by primarily etching the substrate 100. Here, each of the first patterns 108 may have a first height from an upper face of the partially etched substrate 100.

A first etch preventing layer 110 is formed on the first masks 104, the first patterns 108 and the substrate 100. The first etch preventing layer 110 may be conformally formed on the first masks 104, the first patterns 108 and the substrate 100. The first etch preventing layer 110 may prevent sidewalls of the upper active patterns 120 (see FIG. 11) from being etched in successive etching processes.

In some example embodiments, the first etch preventing patterns 110 may be formed using a material having an etching selectivity with respect to the substrate 100. The first etch preventing layer 110 may be formed using a nitride such as silicon nitride, or an oxynitride such as silicon oxynitride. Further, the first mask 104 may be formed by a CVD process or an ALD process.

Figure 9:
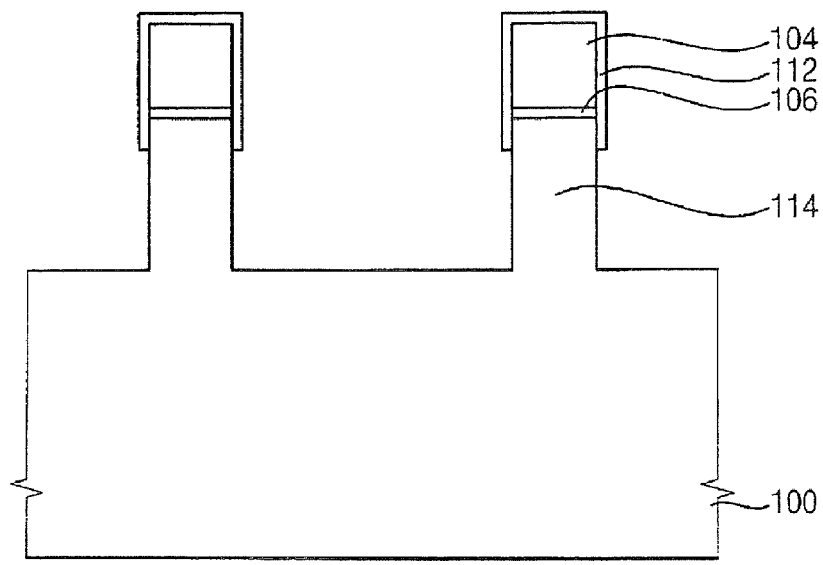

Referring to FIG. 9, the first etch preventing layer 100 and the substrate 100 are partially etched successively using the first masks 104 as etching masks to form first etch preventing layer patterns 112 and second patterns 114 on the substrate 100. The first etch preventing layer patterns 112 may be formed on upper sidewalls of the second patterns 114. That is, the first patterns 108 are changed into the second patterns 114 by secondarily etching the substrate 100.

In some example embodiments, each of the second patterns 114 may include a material substantially the same as that of the substrate 100 because the second patterns 114 are provided by further partially etching the substrate 100. Each of the second patterns 114 may have a second height substantially higher than the first height.

Figure 10:
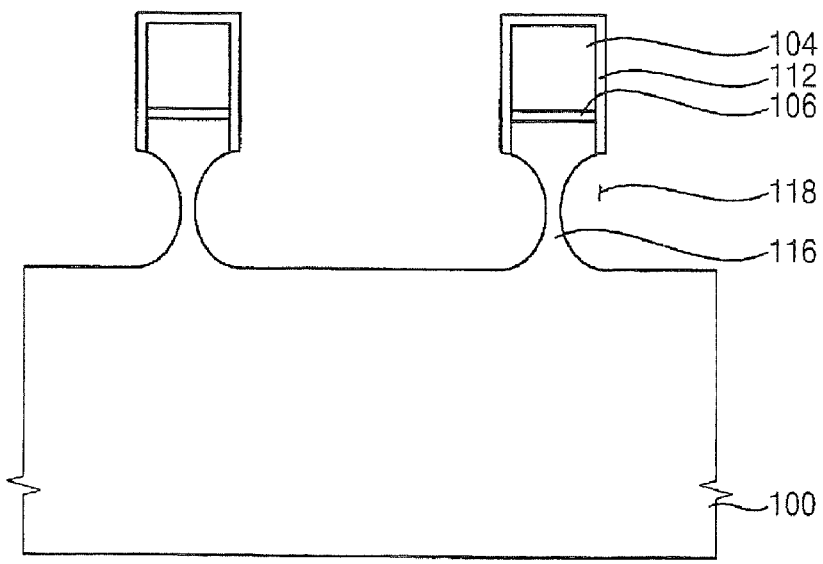

Referring FIG. 10, the sidewalls of the second patterns 114 are partially etched using the first etch preventing layer patterns 112 as etching masks. Hence, the second patterns 114 are changed into third patterns 116, respectively. The third patterns 116 may be formed by an isotropic etching process.

The third patterns 116 may include upper portions and lower portions. In the etching process, the upper portions of the third patterns 116 are substantially not be etched due to the first etch preventing layer patterns 112. Thus, cross-sectional areas of the upper portions of the third patterns 116 may be substantially larger than those of the lower portions of the third patterns 116. The lower portions of the third patterns 116 may have curved or rounded sidewalls. That is, recesses 118 may be provided on sidewalls of the lower portions of the third patterns 116, respectively.

Figure 11:
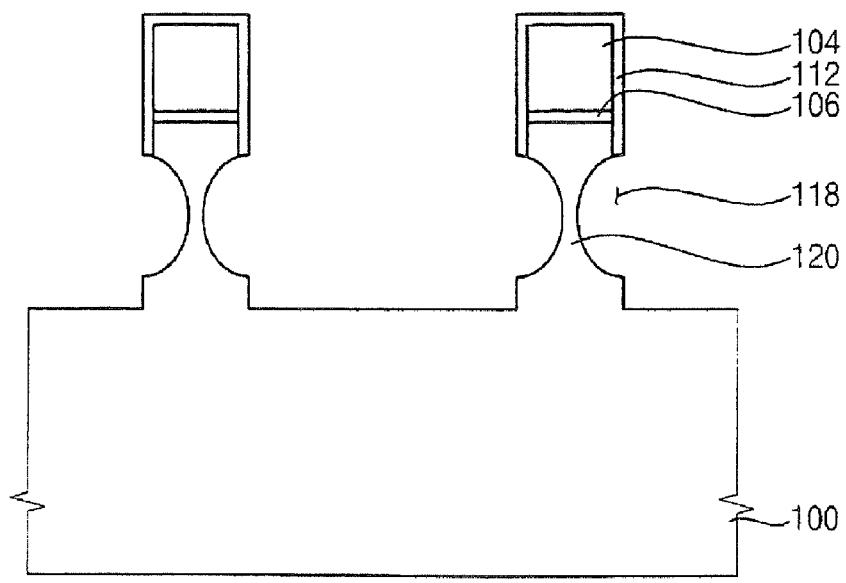

Referring to FIG. 11, portions of the substrate 100 adjacent to the third patterns 116 may be partially etched using the first etch preventing patterns 112 and the first masks 104 as etching masks. Thus, upper active patterns 120 are formed on the substrate 100. The upper active patterns 120 may be formed by an anisotropic etching process.

The upper active patterns 120 may have circular or polygonal pillar structures including the recesses 118 on sidewalls thereof. The upper active patterns 120 may include first upper regions, second upper regions and third upper regions. Second impurity regions 154 (see FIG. 28) are formed in the first upper regions of the upper active patterns 120. Gate insulation layer patterns 122 (see FIG. 12) and gate electrodes 124 (see FIG. 13) are formed on the second upper regions of the upper active patterns 120. The third upper regions of the upper active patterns 120 may reduce mutual interactions between the gate electrodes 124 and wirings such as bit lines. In example embodiments, cross-sectional areas of the first upper regions of the upper active patterns 120 may be substantially larger than those of the second upper regions of the upper active patterns 120 because the recesses 118 are provided in the second upper regions of the upper active patterns 120. Additionally, the second upper regions of the upper active patterns 120 may have cross-sectional areas are substantially the same as or substantially similar to those the third regions of the upper active patterns 120.

In some example embodiments, the upper active patterns 120 may be arranged on the substrate 100 along a first direction and a second direction substantially perpendicular to the first direction. The upper active patterns 120 arranged in the first direction may be disposed along a first virtual line. The upper active patterns 120 arranged in the second direction may be disposed along a second virtual line. Here, the adjacent upper active patterns 120 arranged along first direction may be separated by a first interval. Further, the adjacent upper active patterns 120 arranged along second direction may be separated by a second interval. The first interval may be substantially the same as the second interval.

In other example embodiments, the upper active patterns 120 may be arranged along the first direction and the second direction as illustrated in FIGS. 5 and 6. The upper active patterns 120 arranged along the first direction may be disposed in a zigzag structure. The upper active patterns 120 arranged along the second direction may be disposed in a virtual line. Here, the adjacent upper active patterns 120 arranged along the first direction may be separated by a third interval. Further, the adjacent upper active patterns 120 arranged along the second direction may be separated by a fourth interval. The third interval may be different from the fourth interval. For example, a ratio between the third interval and the fourth interval may be about $\sqrt{2}:1$.

Figure 12:
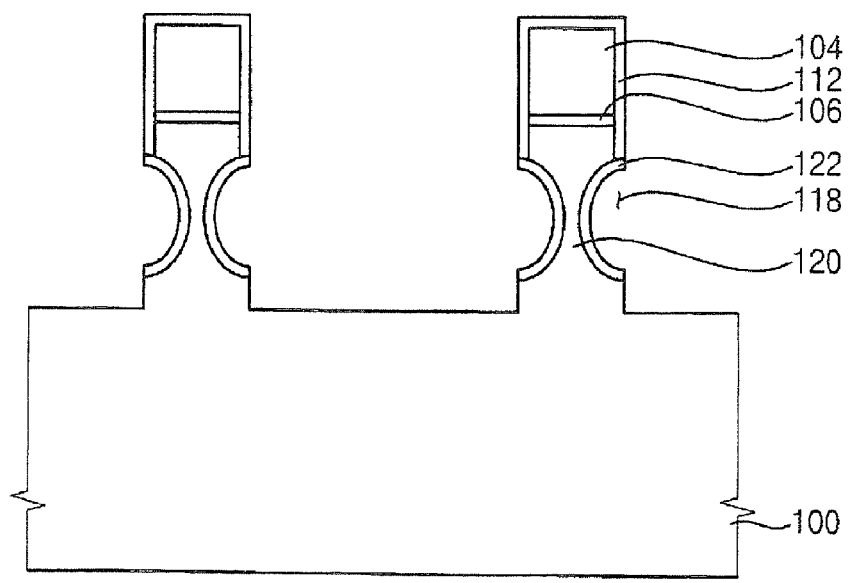

Referring to FIG. 12, the gate insulation layer patterns 122 are formed on the sidewalls of the upper active patterns 120. That is, the gate insulation layer patterns 122 are formed on the insides of the recesses 118. Thus, the recesses 118 may be partially filled with the gate insulation layer patterns 122.

Each of the gate insulation layer patterns 122 may be formed using an oxide or a metal compound. For example, the gate insulation layer patterns 122 may be formed using silicon oxide ($SiO_x$), hafnium oxide ($HfO_x$), zirconium oxide ($ZrO_x$), aluminum oxide ($AlO_x$), tantalum oxide ($TaO_x$), etc. Further, the gate insulation layer patterns 122 may be formed by a CVD process, an ALD process, a thermal oxidation process, etc.

In some example embodiments, the gate insulation layer patterns 122 may be formed in the recesses 118 provided in the second upper regions of the upper active patterns 120.

When the gate insulation layer patterns 122 are formed by the thermal oxidation process, the gate insulation patterns 122 may be formed on the second and the third upper regions of the upper active patterns 120 and on the substrate 100. When the gate insulation layer patterns 122 are formed by the CVD process or the ALD process, the gate insulation patterns 122 may be formed on the first masks 104, the first etch preventing layer patterns 112, the upper active patterns 120 and the substrate 100.

Figure 13:
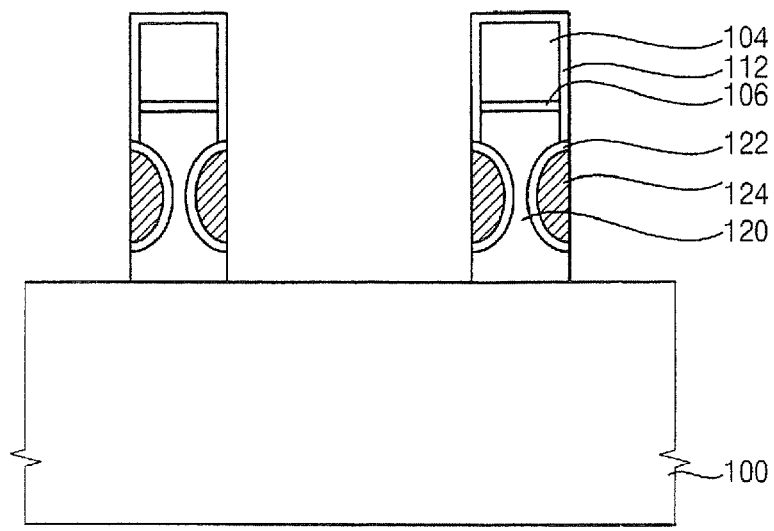

Referring to FIG. 13, the gate electrodes 124 are formed on the gate insulation layer patterns 122, respectively. The gate electrodes 124 may enclose the sidewalls of the upper active patterns 120. That is, the gate electrodes 124 may enclose the second upper regions of the upper active patterns 120. The gate electrodes 124 may fully fill up the recesses 118 provided in the second upper regions of the upper active patterns 120.

In some example embodiments, each of the gate electrodes 124 may be formed using polysilicon doped with impurities, a metal or a metal compound. For example, the gate electrodes 124 may be formed using tungsten (W), tungsten nitride (WNx), tungsten silicide (WSix), titanium (Ti), titanium nitride (TiNx), titanium silicide (TiSix), aluminum (Al), aluminum nitride (AlNx), tantalum (Ta), tantalum nitride (TaNx), tantalum silicide (TaSix), cobalt silicide (CoSix), etc.

Figure 14:
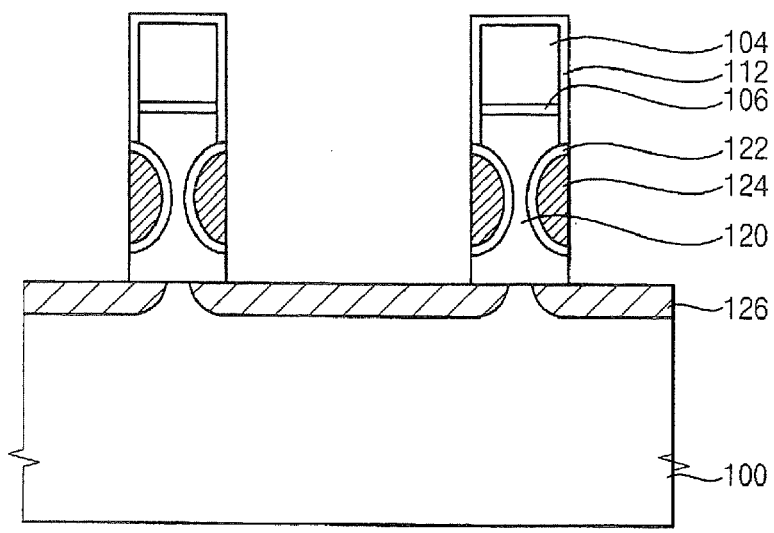

Referring FIG. 14, first impurities are implanted into portions of the substrate 100 adjacent to the upper active patterns 120 to form preliminary first impurity regions 126. The first impurities may include N-type impurities or P-type impurities as occasion demands. For example, the N-type impurities may include phosphorus (P), arsenic (As), antimony (Sb), etc., whereas the P-type impurities may include boron (B), gallium (Ga), indium (In), etc.

In some example embodiments, the first impurities in the preliminary first impurity regions 126 may be diffused into portions of the substrate 100 beneath the upper active patterns 120 by a thermal diffusion process. For example, the adjacent preliminary first impurity regions 126 may make contact with each other.

The preliminary first impurity regions 126 may serve as source/drain regions in a transistor. The preliminary first impurity regions 126 may also serve as the wirings such as the bit lines.

Figure 15:
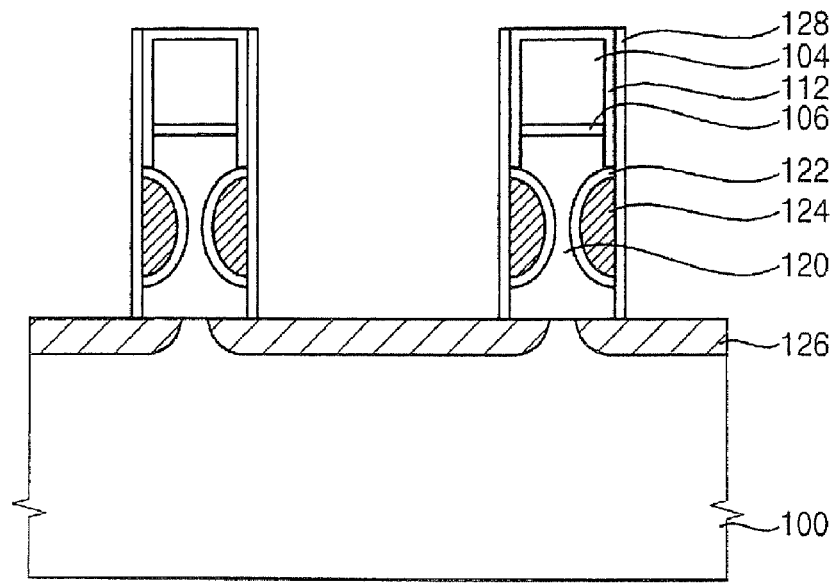

Referring to FIG. 15, second etch preventing patterns 128 are formed on sidewalls of the upper active patterns 120 and the gate electrodes 124. Each of the second etch preventing patterns 128 may be formed using a material having an etching selectivity with respect to the substrate 100. The second etch preventing layer pattern 128 may be formed using a nitride such as silicon nitride or an oxynitiride such as silicon oxynitiride. The second etch preventing patterns 128 may include materials substantially the same as those included in the first etch preventing patterns 112.

Figure 16:
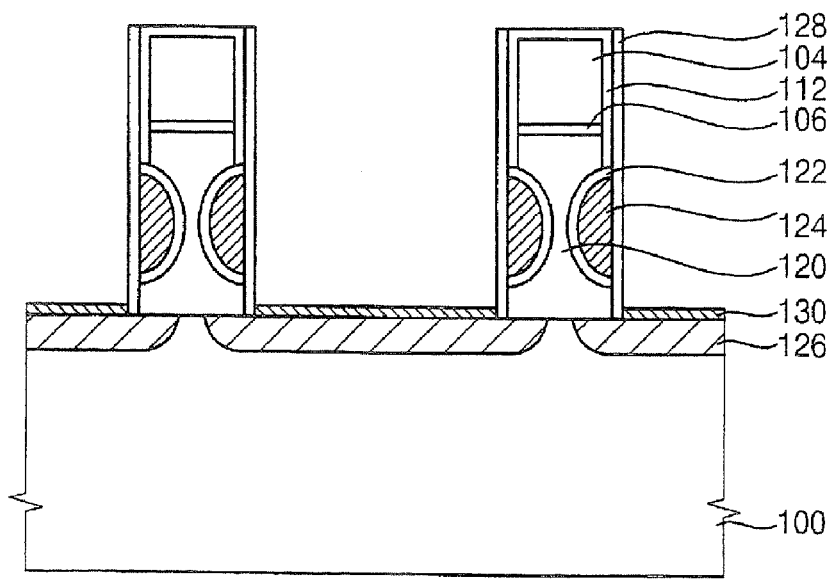

Referring to FIG. 16, a conductive layer 130 including a conductive material is formed on the substrate 100. The conductive layer 130 may be formed using a metal or a metal compound. For example, the conductive layer 130 may be formed using cobalt (Co), titanium (Ti), cobalt silicide (CoSix), titanium silicide (TiSix), etc. These may be used alone or in a mixture thereof. The conductive layer 130 may serve as the wirings such as the bit lines.

In some example embodiments, after a preliminary conductive layer (not illustrated) including a metal is formed on the first masks 104, the second etch preventing patterns 128 and the substrate 100, a thermal treatment process may be performed on the preliminary conductive layer to form the conductive layer 130 on the substrate 100. In the thermal treatment process, the metal in the preliminary conductive layer may react with silicon in the substrate 100 so that the conductive layer 130 including a metal silicide may be provided on the substrate 100. The second etch preventing layer patterns 128 may prevent silicidations of the upper active patterns 120 in the thermal process. After forming the conductive layer 130, a remaining preliminary conductive layer may be removed from the first masks 104, the second etch preventing patterns 128 and the substrate 100.

Figure 17:
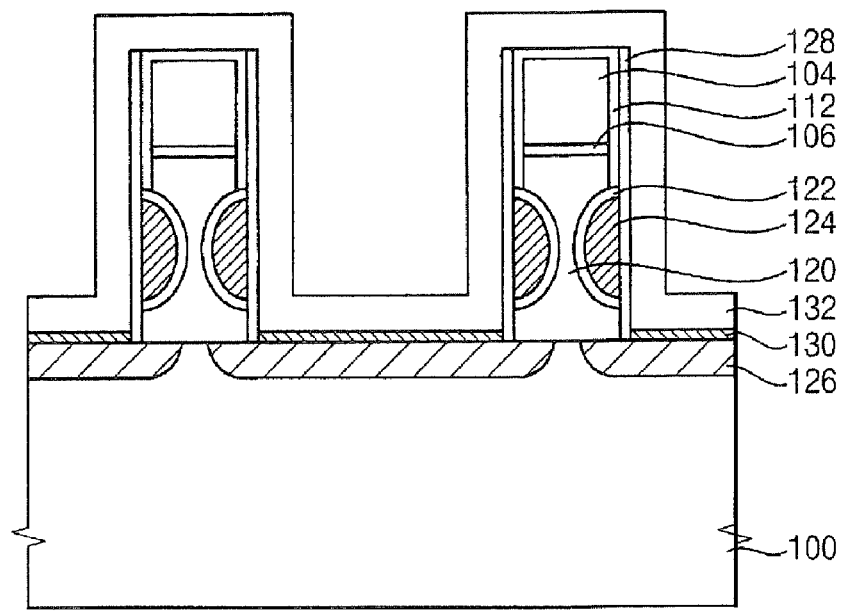

Referring to FIG. 17, a first layer 132 is formed on the first masks 104, the second etch preventing layer patterns 128 and the conductive layer 130. For example, the first layer 132 may be conformally formed on the first masks 104, the second preventing layer patterns 128 and the conductive layer 130.

The first layer 132 may be formed using a material having an etching selectivity with respect to the substrate 100. The first layer 132 may be formed using an oxide, a nitride or an oxynitride. For example, the first layer 132 may be formed using middle temperature oxide (MTO), boro-phosphor silicate glass (BPG), phosphor silicate glass (PSG), undoped silicate glass (USG), flowable oxide (FOX), plasma enhanced-tetraethylorthosilicate (PE-TEOS), tonensilazene (TOSZ), fluoride silicate glass (FSG), etc. Further, the first layer 132 may be formed by a CVD process, a plasma treatment process, a thermal oxidation process, etc.

In some example embodiments, the substrate 100 may substantially be not etched when the first layer 132 is etched in a following etching process because the first layer 132 may include the material having the etching selectivity with respect to the substrate 100.

Figure 18:
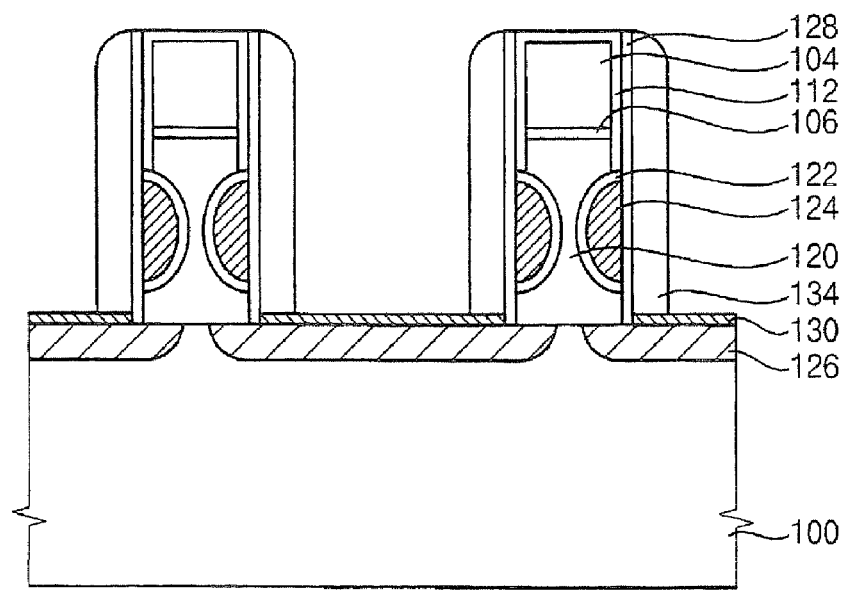

Referring to FIG. 18, the first layer 132 is partially etched to form sacrificial spacers 134 on the sidewalls of the upper active patterns 120, the first masks 104 and the gate electrodes 124. The sacrificial spacers 134 may be formed by an anisotropic etching process. The sacrificial spacers 134 may prevent the upper active patterns 120 and the gate electrodes 124 from being etched in a following etching process so that an etching margin of the following process may be sufficiently ensured.

Figure 19:
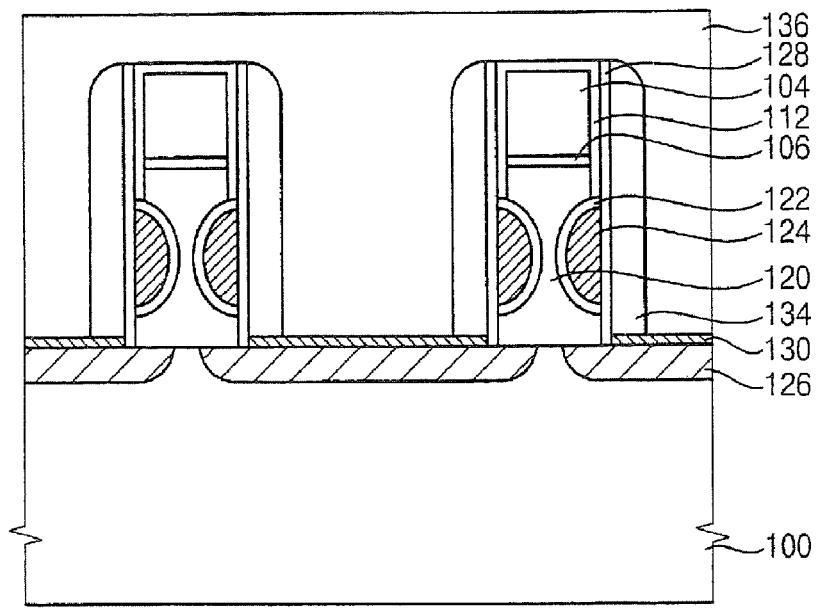

Referring to FIG. 19, a second layer 136 is formed on the substrate 100 to cover the resultant structure. For example, the second layer 136 is formed to have a desired thickness sufficiently covering the first masks 104 and the conductive layer 130. The second layer 136 may be formed using a material having an etching selectivity with respect to substrate 100. The second layer 136 may be formed using a carbon containing material such as silicon on carbon (SOC).

In some example embodiments, the second layer 136 may have a level upper face by a planarization process. The planarization process may include a chemical mechanical polishing (CMP) process and/or an etch-back process.

Figure 20:
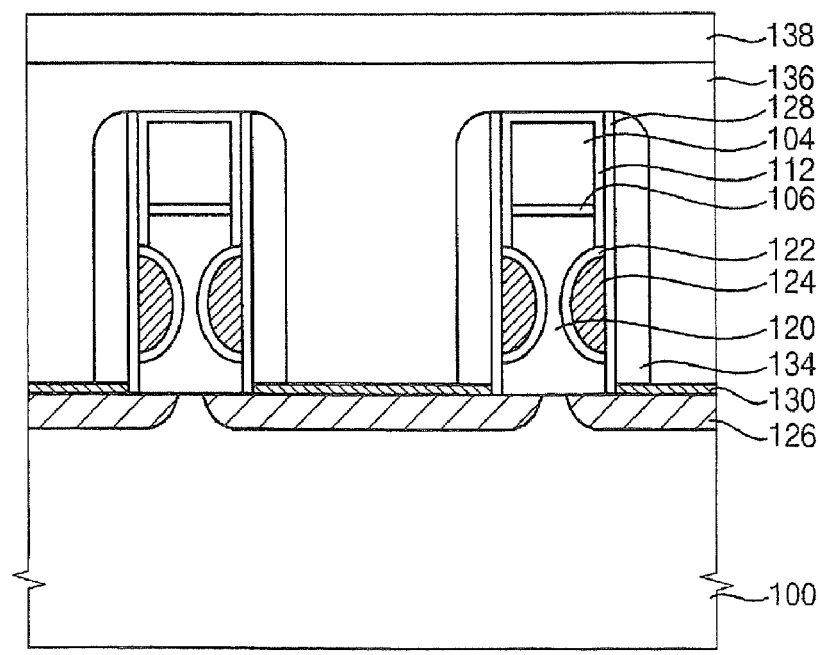

Referring to FIG. 20, a third layer 138 is provided on the second layer 136. The third layer 138 may be formed using an organic material. For example, the third layer may be formed using an anti-reflective coating (ARC) compound containing silicon (Si). The third layer 138 may prevent diffused reflection of light from sidewalls of photoresist patterns 140 (see FIG. 21) in a following photolithography process.

Figure 21:
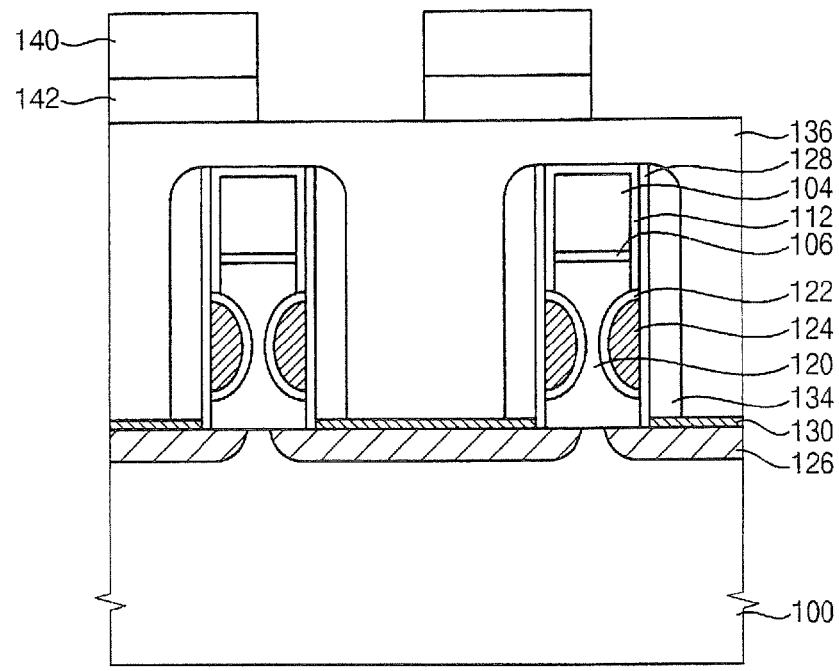

Referring to FIG. 21, the photoresist patterns 140 are formed on the third layer 138. The photoresist patterns 140 selectively expose the third layer 138.

Exposed portions of the third layer 138 are etched using the photoresist patterns 140 as etching masks to form second masks 142 on the second layer 136. The third layer 138 may be partially etched by an anisotropic etching process. In this etching process, the photoresist patterns 140 may also be partially etched.

Figure 22:
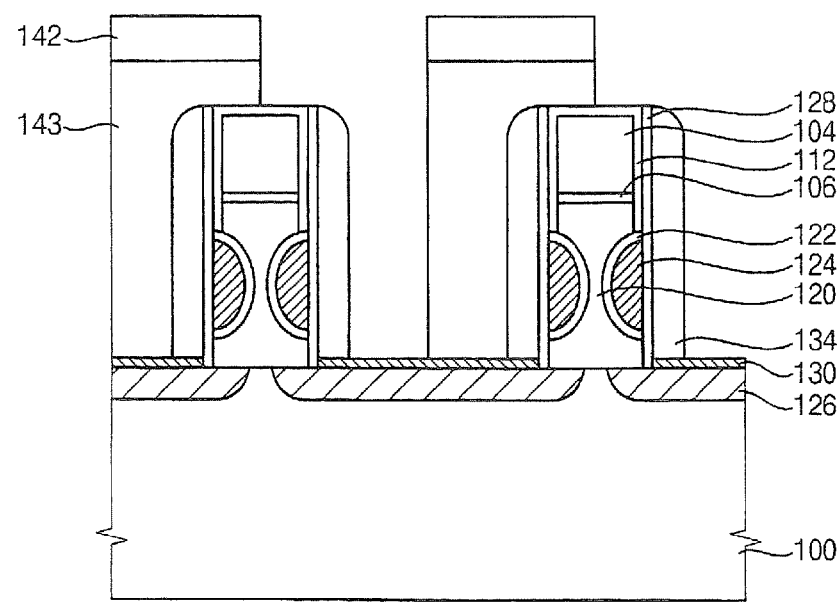

Referring to FIG. 22, the second layer 136 is partially etched using the photoresist patterns 140 and the second masks 142 as etching masks to form third masks 143 over the substrate 100. The first masks 104, the sacrificial spacers 134 and the conductive layer 130 are partially exposed through the third masks 143. Each of the second and the third masks 142 and 143 may have a multilayer structure. After forming the third masks 143, residues of the photoresist patterns 140 may be removed from the second masks 142.

Figure 23:
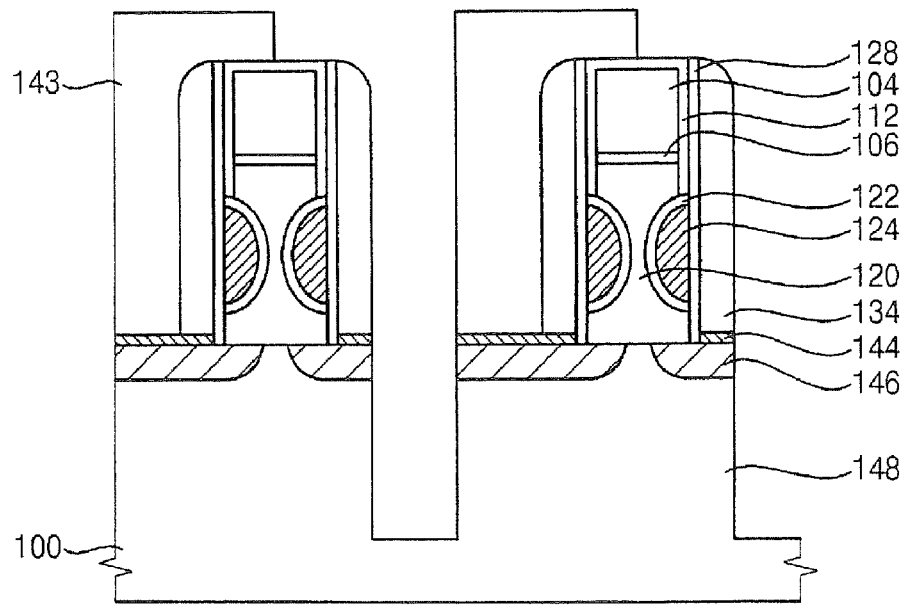

Referring to FIG. 23, the conductive layer 130, the preliminary first impurity regions 126 and the substrate 100 are partially etched using the second and the third masks 142 and 143. Thus, conductive layer patterns 144, first impurity regions 146 and lower active patterns 148 are provided on the substrate 100. The conductive layer patterns 144, the first impurity regions 146 and the lower active patterns 148 may be formed by an anisotropic etching process.

The lower active patterns 148 may extend along the first direction. The conductive layer patterns 144 and the first impurity regions 146 may also extend along the first direction. The lower active patterns 148 may be arranged in the second direction substantially perpendicular to the first direction.

In some example embodiments, the conductive layer patterns 144 and the first impurity regions 146 may serve together as the wirings such as the bit lines. Further, the first impurity regions 146 may serve as the source/drain regions of the transistors.

The lower active patterns 148 may include first lower regions and second lower regions. The upper active patterns 120 may be positioned on the first lower regions of the lower active patterns 148, respectively. The conductive layer patterns 144 and the first impurity regions 146 may be formed in the second lower regions of the lower active patterns 148. Further, the lower active patterns 148 may include first sidewalls and second sidewalls. Each of the first and the second sidewalls may face each other along the second direction.

Array structures of the lower active patterns 148 may vary in accordance with those of the upper active patterns 120. In an example embodiment, when the upper active patterns 120 are disposed in the first and the second virtual lines and separated by a predetermined interval, the first sidewalls of the lower active patterns 148 may include protruding portions. The protruding portions of the lower active patterns 148 may belong to the first lower regions of the lower active patterns 148.

In another example embodiment, when the upper active patterns 202 are arranged along the first direction in the zigzag structure and along the second direction such as the virtual line as illustrated in FIGS. 5 and 6, the first and the second sidewalls of the lower active patterns 210 may include first protruding portions and second protruding portions, respectively. The first and the second protruding portions may belong to the first lower regions of the lower active patterns 148.

Since the lower active patterns 148 may include the protruding portions and the upper active patterns 120 partially overlap with the protruding portions, widths of the wirings, such as the bit lines, may increase. When the widths of the bit lines are increased, electrical resistances of the bit lines may be reduced. Further, the bit lines include the first impurity regions 146 and the conductive layer patterns 144 so that the electrical resistances of the bit lines may be further reduced.

In example embodiments, when the substrate 100 are partially etched using the second and the third masks 142 and 143 as etching masks to form the lower active patterns 148, the third masks 143 may be removed in this etching process.

Figure 24:
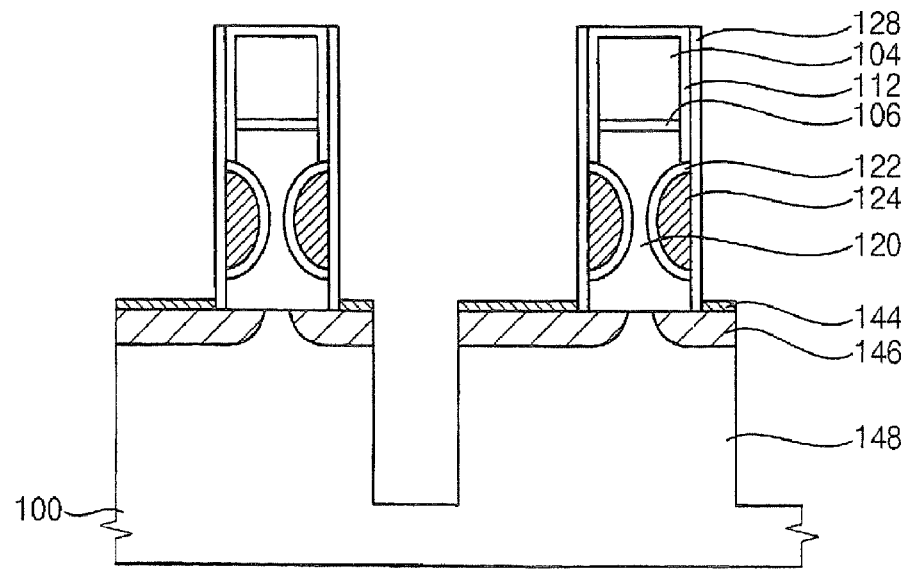

Referring to FIG. 24, the third masks 143 are removed from the substrate 100. When the third masks 143 include SOC, the third masks 143 may be easily removed from the substrate 100 by an ashing process and/or a stripping process.

When the second masks 142 remain on the third masks 143, the second masks 142 may also be removed from the substrate 100. The second masks 142 may removed by a dry etching process and/or a wet etching process.

After removing the third masks 142, the sacrificial spacers 134 are removed from the substrate 100. The sacrificial spacers 134 may be removed by a wet etching process.

Figure 25:
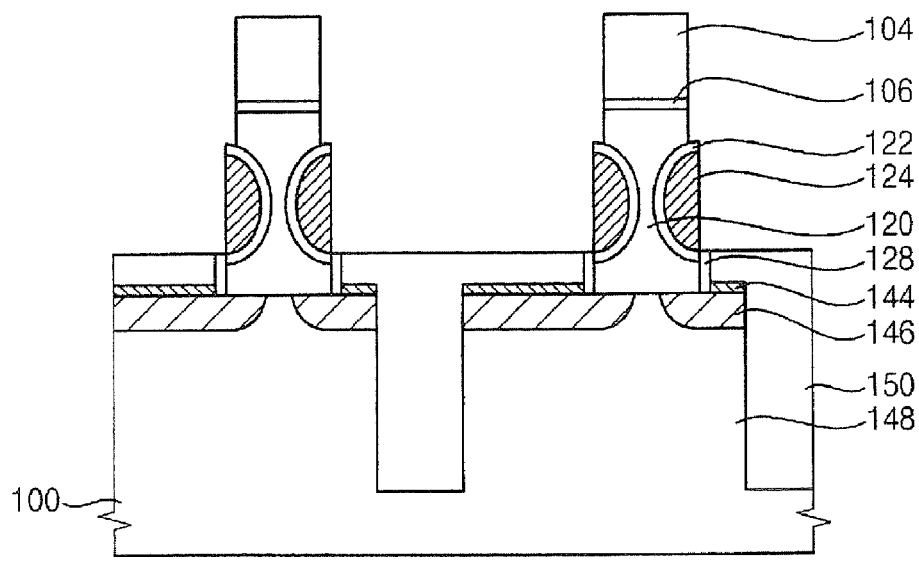

Referring to FIG. 25, field isolation layer patterns 150 are formed on the substrate 100 to cover the lower active patterns 148. The field isolation layer patterns 150 may be formed using an oxide such as BPSG, PSG, USG, FOX, PE-TEOS, TOSZ, FSG, etc.

In some example embodiments, the field isolation layer patterns 150 may have heights substantially higher than those of the lower active patterns 148. The field isolation layer patterns 150 may cover lower portions of the upper active patterns 120. Thus, mutual electrical interference between the first impurity regions 146 and the gate electrodes 124 may be reduced.

After formations of the field isolation layer patterns 150, the first and the second etch preventing layer patterns 112 and 128 are removed from the upper active patterns 120. The first and the second etch preventing layer patterns 112 and 128 may be removed by a wet etching process. In example embodiments, portions of the second etch preventing layer patterns 128 covered with the field isolation layer patterns 150 may remain on the substrate 100.

In one example embodiment, while removing the first and the second etch preventing layer patterns 112 and 128, the first masks 104 may be partially etched. In another example embodiment, the first masks 104 may be fully etched when the first and the second preventing layer patterns 112 and 128 are removed.

Figure 26:
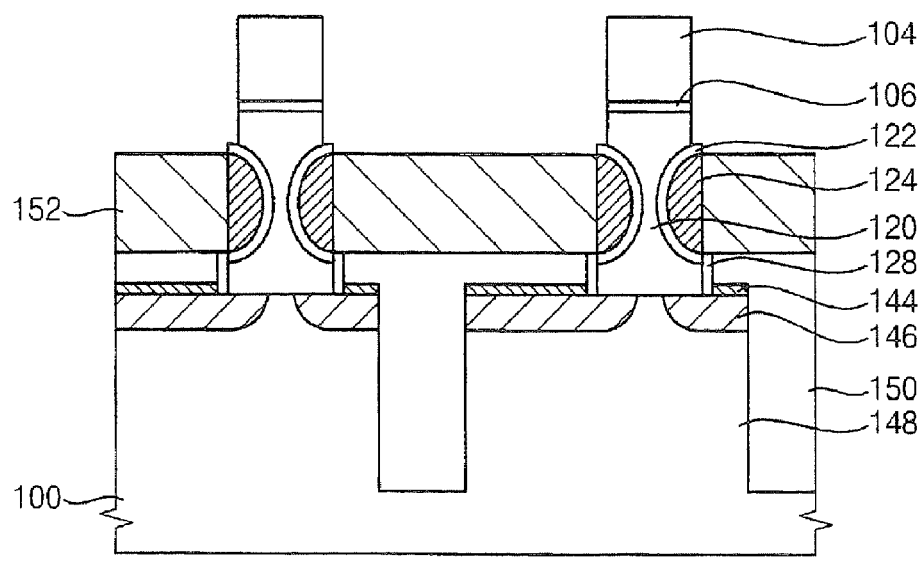

Referring to FIG. 26, word lines 152 are formed on the field isolation layer patterns 150 to make electrical contact with adjacent gate electrodes 124, respectively. Each of the word lines 152 may be formed using a metal and a metal compound. For example, the word line 152 may be formed using tungsten (W), tungsten nitride ($WN_x$), tungsten silicide ($WSi_x$), tantalum (Ta), tantalum nitride ($TaN_x$), tantalum silicide ($TaSi_x$), aluminum (Al), aluminum nitride ($AlN_x$), etc.

The upper active patterns 120 may be provided on the lower active patterns 148. Each of the word lines 152 may extend along the second direction substantially perpendicular to the first direction. Each of the word lines 152 may make electrical contact with one of the gate electrodes 124 provided on the upper active patterns 120 disposed on the lower active patterns 148. In example embodiments, each of the word lines 152 may have a thickness substantially the same as those of the gate electrodes 124.

Figure 27:
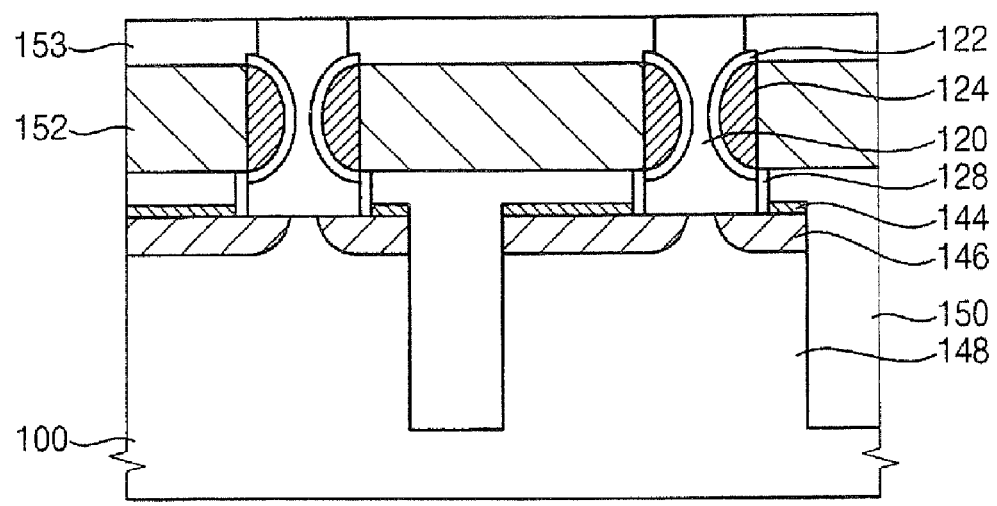

Referring to FIG. 27, an insulating interlayer 153 is formed on the first masks 104, the upper active patterns 120 and the word lines 152. The insulating interlayer 153 may be formed using an oxide such as BPSG, PSG, USG, FOX, PE-TEOS, TOSZ, FSG, etc. The insulating interlayer 153 may include a material substantially the same as those in the field isolation layer patterns 150.

In some example embodiments, the insulating interlayer 153 may be planarized until the first masks 104 are exposed. The planarization process may include a CMP process and/or an etch-back process.

When the first masks 104 are formed on the upper active patterns 120, the first masks 104 and the pad oxide layer patterns 106 may be removed from the upper active patterns 120 to expose upper faces of the upper active patterns 120. The first masks 104 and the pad oxide layer patterns 106 may be removed by a wet etching process or a dry etching process. While removing the first masks 104 and the pad oxide layer patterns 106, the insulating interlayer 153 may be partially etched. Here, the insulating interlayer 153 may have a height substantially the same as those of the upper active patterns 120.

Figure 28:
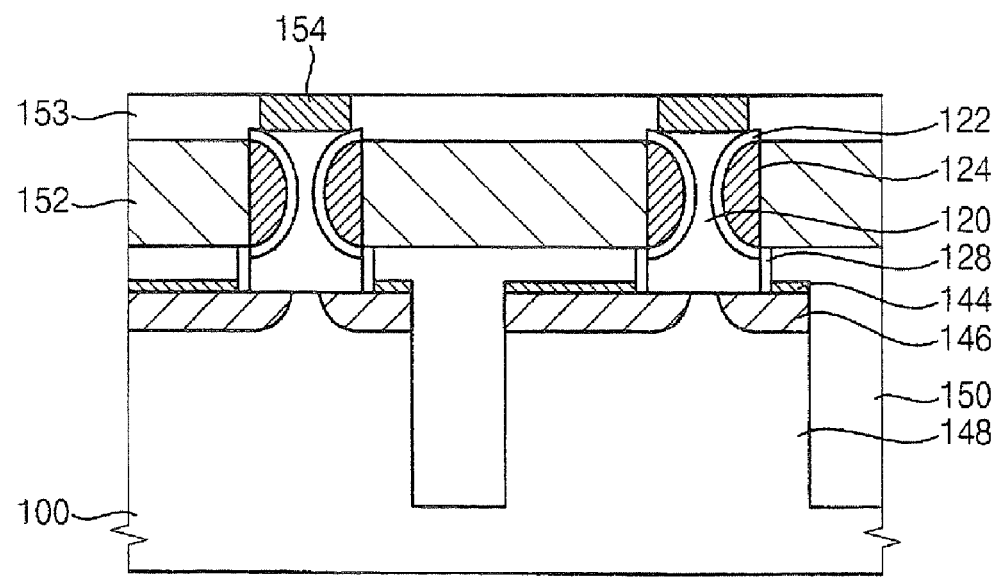

Referring to FIG. 28, second impurities are implanted into the surface portions of the upper active patterns 120 to form second impurity regions 154. The second impurities may include N-type impurities or P-type impurities. The N-type impurities may include phosphorus (P), arsenic (As), antimony (Sb), etc., whereas the P-type impurities may include boron (B), gallium (Ga), indium (In), etc. The second impurities may be substantially the same as the first impurities. The second impurity regions 154 may also serve as the source/drain regions of the transistors.

According to example embodiments of the present invention, transistors may be provided on the substrate 100. The transistors may include the gate insulation layer patterns 122, the gate electrodes 124 enclosing the upper active patterns 120, the first impurity regions 146 formed under the gate electrodes 124, and the second impurity regions 154 formed over the gate electrodes 124. The transistors may include channel regions formed in the upper active patterns 120 along a direction substantially perpendicular to the substrate 100. The first impurity regions 146 and the conductive layer patterns 144 may serve as the wirings, such as the bit lines, disposed under the transistors.

According to the present invention, the areas of bit lines may increase because upper active patterns are formed on sides of lower active patterns so that electrical resistances of the bit lines may be reduced.

The bit lines include the conductive layer patterns having conductive materials and first impurity regions. Therefore, the electrical resistances of the bit lines may be considerably reduced.

Additionally, in a etching process of a substrate to form the lower active patterns, second masks include a first layer having SOC and a second layer having an ARC containing silicon are used as an etching mask so that the substrate may be easily etched. The second masks may be easily removed by an ashing process and/or a stripping process.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor device comprising:
   a first active pattern protruding from a substrate, the first active pattern including a first region and a second region and extending along a first direction, wherein the first active pattern includes a protruding portion protruding along a second direction different from the first direction, the protruding portion including at least a portion of the first region;
   a second active pattern having a pillar structure on the first region of the first active pattern;
   a gate electrode enclosing a sidewall of the second active pattern;
   a conductive layer pattern formed in the second region of the first active pattern;
   a first impurity region formed in the second region of the first active pattern; and
   a second impurity region formed at a surface portion of the second active pattern.

2. The semiconductor device of claim 1, wherein the conductive layer pattern includes a metal or a metal compound.

3. The semiconductor device of claim 2, wherein the conductive layer pattern includes at least one selected from the group consisting of cobalt (Co), titanium (Ti), cobalt silicide ($CoSi_x$) and titanium silicid ($TiSi_x$).

4. A semiconductor device comprising:
   lower active patterns protruding from a substrate, the lower active patterns including first lower regions and second lower regions, and extending along a first direction, wherein the lower active patterns include protruding portions protruding along a second direction different from the first direction, the protruding portions including at least a portion of the first lower regions;
   upper active patterns having pillar structures on the first lower regions of the lower active patterns;
   gate electrodes enclosing sidewalls of the upper active patterns;
   conductive layer patterns formed in the second lower regions of the lower active patterns;
   first impurity regions formed in the second lower regions of the lower active patterns; and
   second impurity regions formed at surface portions of the upper active patterns.

5. The semiconductor device of claim 4, wherein the lower active patterns include first sidewalls and second sidewalls, the first and the second sidewalls face each other along the second direction, and the protruding portions are disposed on the first sidewalls.

6. The semiconductor device of claim 4, wherein the lower active patterns include first sidewalls and second sidewalls, the first and the second sidewalls face each other along the second direction, and the protruding portions are disposed on the first and the second sidewalls in a zigzag structure.

7. The semiconductor device of claim 4, further comprising:
   field insulation layer patterns covering the lower active patterns; and
   word lines formed on the field insulation layer patterns wherein the word lines make electrical contact with one of the gate electrodes formed on the upper active patterns positioned on the lower active patterns.

8. The semiconductor device of claim 4, wherein the conductive layer patterns include a metal or a metal compound.

* * * * *